United States Patent
Maejima

(10) Patent No.: US 8,369,127 B2
(45) Date of Patent: Feb. 5, 2013

(54) NONVOLATILE SEMICONDUCTOR MEMORY DEVICE WITH TRANSISTOR AND VARIABLE RESISTOR

(75) Inventor: Hiroshi Maejima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 319 days.

(21) Appl. No.: 12/707,278

(22) Filed: Feb. 17, 2010

(65) Prior Publication Data

US 2010/0208509 A1 Aug. 19, 2010

(30) Foreign Application Priority Data

Feb. 19, 2009 (JP) .................................. 2009-036056

(51) Int. Cl.
*G11C 11/00* (2006.01)
(52) U.S. Cl. ............. 365/148; 365/51; 365/72; 365/171
(58) Field of Classification Search .................. 365/148, 365/51, 72, 171
See application file for complete search history.

(56) References Cited

U.S. PATENT DOCUMENTS

| | | | |
|---|---|---|---|
| 6,903,961 B2 * | 6/2005 | Tsukikawa et al. ........... | 365/149 |
| 7,593,253 B2 | 9/2009 | Takemura et al. | |
| 7,745,894 B2 * | 6/2010 | Asao et al. .................... | 257/421 |
| 8,179,707 B2 * | 5/2012 | Song et al. ....................... | 365/51 |
| 2009/0174032 A1 | 7/2009 | Maejima et al. | |

* cited by examiner

*Primary Examiner* — Connie Yoha
(74) *Attorney, Agent, or Firm* — Oblon, Spivak, McClelland, Maier & Neustadt, L.L.P.

(57) ABSTRACT

A nonvolatile semiconductor memory device according to the present invention includes a memory cell array layer including a first line; a plurality of second and third lines that are formed below or above the first line and cross each other; and a plurality of memory cells arranged at each intersection of the second and third lines, the memory cell including a variable resistor and a transistor, which are connected to each other in series between the first line and the third line, the variable resistor being electrically rewritable and storing a resistance value as data in a nonvolatile manner, and the transistor being a columnar transistor having the second line arranged at its side face as a gate.

13 Claims, 15 Drawing Sheets

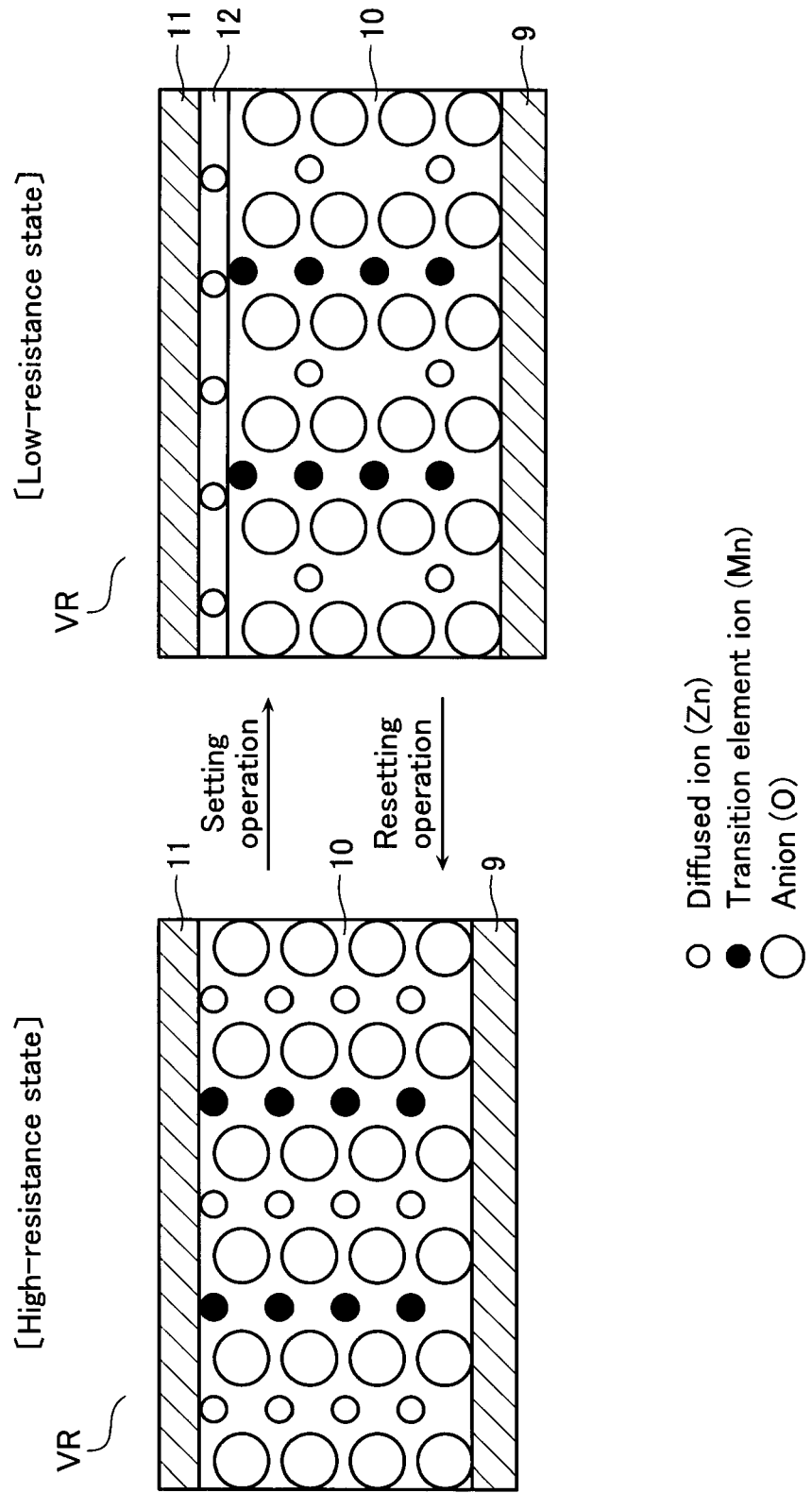

NONVOLATILE SEMICONDUCTOR MEMORY DEVICE WITH TRANSISTOR AND VARIABLE RESISTOR

CROSS-REFERENCE TO RELATED APPLICATIONS

This application is based upon and claims the benefit of priority from the prior Japanese Patent Application No. 2009-36056, filed on Feb. 19, 2009, the entire contents of which are incorporated herein by reference.

BACKGROUND OF THE INVENTION

1. Field of the Invention

The present invention relates to a nonvolatile semiconductor memory device, and more particularly to a nonvolatile semiconductor memory device employing a variable resistor that stores an electrically rewritable resistance value as data in a nonvolatile manner, and a production method thereof.

2. Description of the Related Art

There has conventionally been known a flash memory, as an electrically rewritable nonvolatile memory, which includes a memory cell array of NAND-connected or NOR-connected memory cells having a floating gate structure. A ferroelectric memory is also known as a nonvolatile fast random access memory.

On the other hand, technologies of patterning memory cells much finer include a resistance variable memory, which uses a variable resistor in a memory cell as proposed. Known examples of the variable resistor include a phase change memory element that varies the resistance in accordance with the variation in crystal/amorphous states of a chalcogenide compound; an MRAM element that uses a variation in resistance due to the tunnel magneto-resistance effect; a polymer ferroelectric RAM (PFRAM) memory element including resistors formed of a conductive polymer; and a ReRAM element that causes a variation in resistance upon electrical pulse application (Patent Document 1: Japanese Patent Application Laid-Open No. 2006-344349, paragraph 0021).

It has been known that there are two operation modes in the ReRAM variable resistor. One of them is such that the high-resistance state and the low-resistance state are changed by the control of the voltage value and the application time without changing the polarity of the applied voltage. This mode is referred to as a unipolar type. The other one is such that the high-resistance state and the low-resistance state are changed by changing the polarity of the applied voltage. This mode is referred to as a bipolar type.

Since the variable resistor and the rectifying element such as a diode are connected in series in the unipolar memory cell, the memory cells are easy to be stacked. Further, when the nonvolatile memory is configured three-dimensionally, high integration of the memory cell can be achieved (Patent Document 2: Japanese Patent Application Laid-Open No. 2005-522045). In the memory cell array using the unipolar memory cell employing a diode, all word lines have to rise when the memory cell is accessed, so that the first access is slow. Since many memory cells are inversely biased, the power consumption increases, which limits the through-put.

On the other hand, in the memory cell employing a transistor instead of a diode, only the selected word line and bit line may be moved upon the access to the memory cell, whereby the first access can be accelerated. Further, the power consumption can be reduced, and high through-put can be obtained. Moreover, the memory cell using a transistor can be operated as a bipolar memory cell by changing the polarity of the applied voltage with respect to the source voltage to the bit line and the word line. However, the integration is poorer than that of the memory cell using a diode, which is a problem.

SUMMARY OF THE INVENTION

An aspect of the present invention provides a nonvolatile semiconductor memory device including: a memory cell array layer including a first line; a plurality of second and third lines that are formed below or above the first line and that cross each other; and a plurality of memory cells arranged at each intersection of the second and third lines, the memory cell including a variable resistor and a transistor, which are connected to each other in series between the first line and the third line, the variable resistor being electrically rewritable and storing a resistance value as data in a nonvolatile manner, and the transistor being a columnar transistor having the second line arranged at its side face as a gate.

Another aspect of the present invention provides a nonvolatile semiconductor memory device including: a first memory section including a first memory cell array layer having a first line, a plurality of second and third lines that are formed above or below the first line and cross each other, and a plurality of first memory cells arranged at each intersection of the second and third lines; a second memory section including a second memory cell array layer having a plurality of fourth and fifth lines that cross each other, and a plurality of second memory cells arranged at each intersection of the fourth and fifth lines; and a control section that controls a memory operation of the first and second memory sections, the first memory cell including a variable resistor and a transistor connected in series between the first and third lines, the variable resistor being electrically rewritable and storing a resistance value as data in a nonvolatile manner, and the transistor being a columnar transistor having the second line arranged at its side face as a gate, and the second memory cell including a variable resistor and a diode that are connected in series between the fourth and fifth lines, are electrically rewritable, and store the resistance value as data in a nonvolatile manner.

Another aspect of the present invention provides a production method of a nonvolatile semiconductor memory device, including: sequentially forming a first line layer, a first insulating layer, and a second line layer; forming a plurality of second lines extending in a predetermined direction through a selective etching of the second line layer; forming a second insulating layer on the second line; forming a memory-cell forming hole so as to penetrate the second insulating layer, the second line, and the first insulating layer; forming a gate insulating layer at an inner peripheral surface of the memory-cell forming hole; and sequentially stacking a silicon layer and a variable resistor material, which constitute a transistor, at the memory-cell forming hole having the insulating layer formed on its inner peripheral surface.

BRIEF DESCRIPTION OF THE DRAWINGS

FIG. 3 is a schematic cross-sectional view illustrating one example of a variable resistor according to the first embodiment;

FIGS. 7A to 16A are cross-sectional views, taken along line I-I' and seen from the direction of the arrow in FIG. 2, for explaining a production method of the nonvolatile semiconductor memory device according to the first embodiment;

FIGS. 7B to 16B are cross-sectional views, taken along line II-II' and seen from the direction of the arrow in FIG. 2, for explaining a production method of the nonvolatile semiconductor memory device according to the first embodiment;

DETAILED DESCRIPTION OF THE EMBODIMENTS

Embodiments of the nonvolatile semiconductor memory device according to the present invention will now be described with reference to the drawings.

[First Embodiment]

[Overall System]

Figure 1:
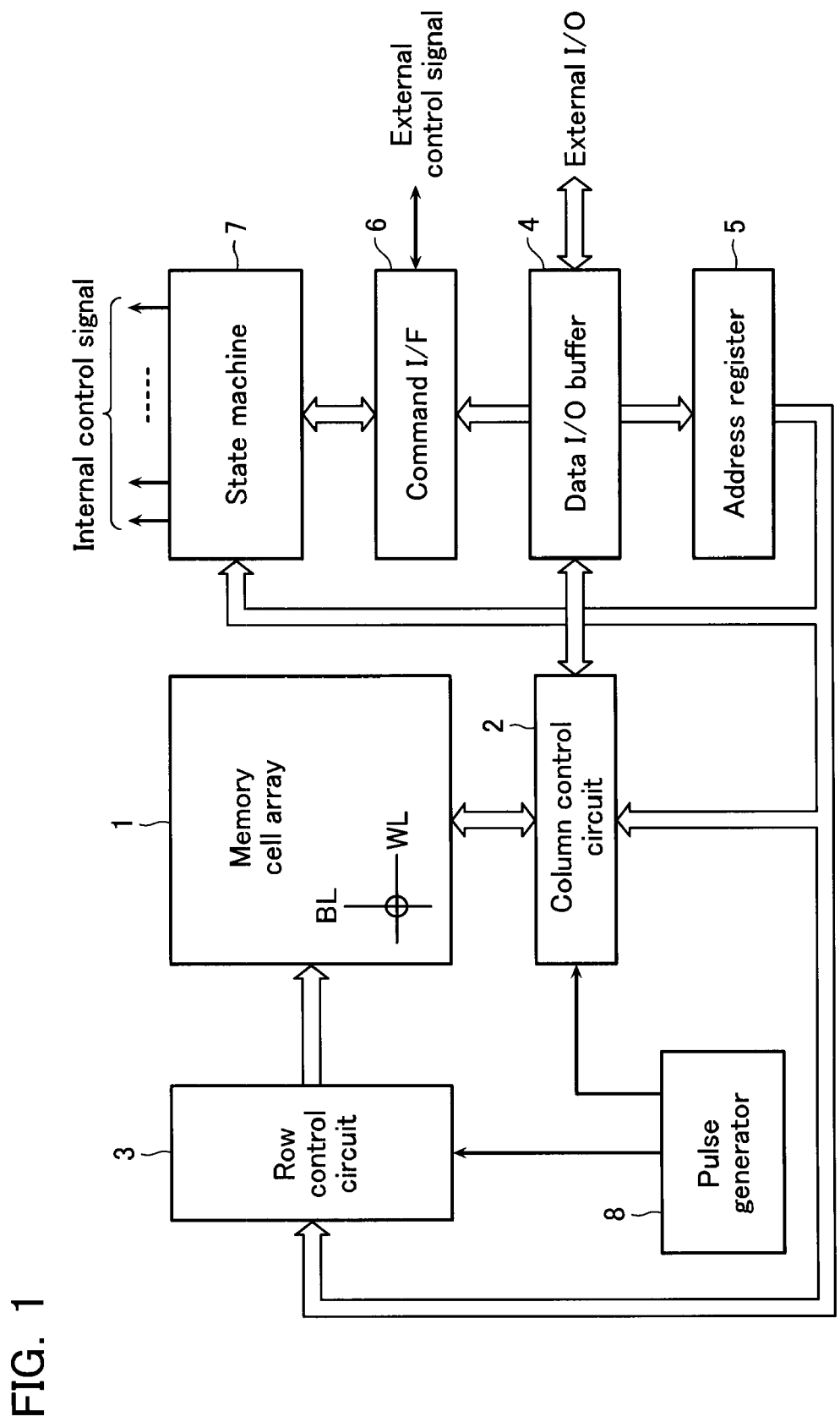
FIG. 1 is a block diagram of a nonvolatile semiconductor memory device according to a first embodiment of the present invention.

FIG. 1 is a block diagram of a nonvolatile semiconductor memory device according to a first embodiment of the present invention.

The nonvolatile semiconductor memory device includes a memory cell array 1 of memory cells arranged in matrix, each memory cell including a later-described ReRAM (variable resistor). A column control circuit 2 is provided on a position adjacent to the memory cell array 1 in a bit line BL direction. The column control circuit 2 controls the bit line BL in the memory cell array 1 to erase data from the memory cell, write data in the memory cell, and read data from the memory cell. A row control circuit 3 is provided on a position adjacent to the memory cell array 1 in a word line WL direction. The row control circuit 3 selects the word line WL in the memory cell array 1 and applies voltages required to erase data from the memory cell, write data in the memory cell, and read data from the memory cell.

A data I/O buffer 4 is connected to an external host, not shown, via an I/O line to receive write data, receive erase instructions, output read data, and receive address data and command data. The data I/O buffer 4 sends received write data to the column control circuit 2, receives read data from the column control circuit 2 and outputs it to outside. An address fed from outside to the data I/O buffer 4 is sent via an address register 5 to the column control circuit 2 and the row control circuit 3. A command fed from the host to the data I/O buffer 4 is sent to a command interface 6. The command interface 6 receives an external control signal from the host and determines whether the data fed to the data I/O buffer 4 is write data, a command or an address. If it is a command, then the command interface 6 transfers it as a received command signal to a state machine 7. The state machine 7 manages the entire nonvolatile semiconductor memory device to receive commands from the host, read, write, erase, and execute data I/O management. The external host can also receive status information managed by the state machine 7 and determine the operation result. The status information is also utilized for control of write and erase.

The state machine 7 controls a pulse generator 8. Under this control, the pulse generator 8 is allowed to output a pulse of any voltage at any timing. Specifically, the state machine 7 receives an externally-fed address via the address register 5 to determine which memory layer is the access target, and uses a parameter corresponding to that memory layer to control the height and width of the pulse from the pulse generator 8. This parameter is a value derived by grasping characteristics of write and the like in the memory layers to even write characteristics in the memory layers, and saved in the memory cells. The pulse formed herein can be transferred to any line selected by the column control circuit 2 and the row control circuit 3.

Peripheral circuit elements other than the memory cell array 1 can be formed in a silicon substrate immediately beneath the memory cell array 1. Thus, the chip area of the semiconductor memory device can be made almost equal to the area of the memory cell array 1.

[Outline of Memory Cell Array]

Figure 2:
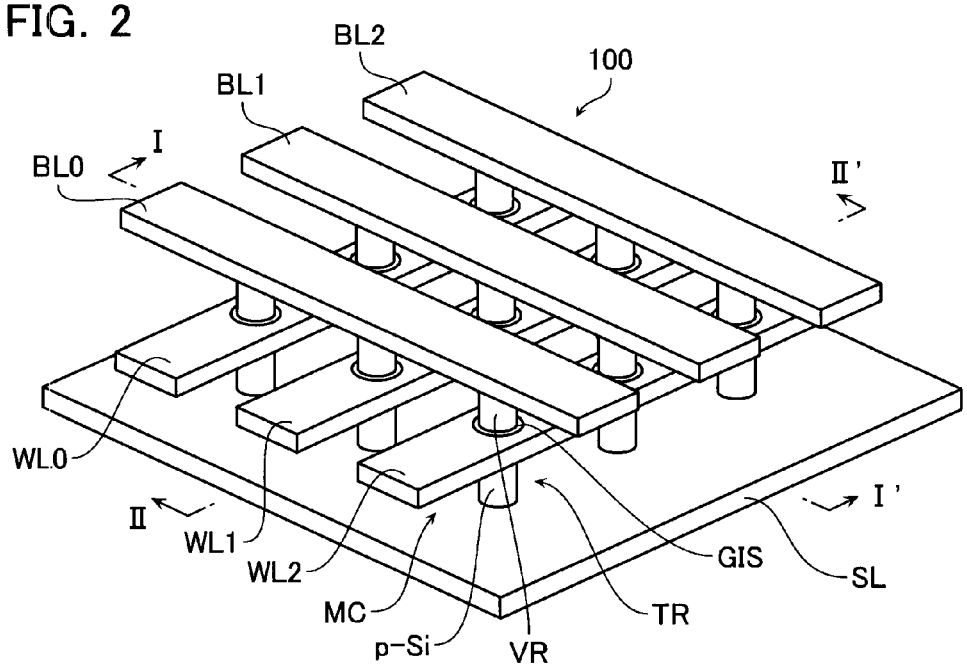
FIG. 2 is a perspective view of part of a memory cell array in the nonvolatile semiconductor memory device according to the first embodiment.

FIG. 2 is a perspective view showing a part of a memory cell array 100, which is one example of the memory cell array 1.

The memory cell array 100 includes a source line SL, which is a plane first line formed on a silicon substrate, not shown. The memory cell array 100 also includes a plurality of word lines WL0 to WL3, which are the second lines, extending in the direction of II-II' line (hereinafter referred to as "row direction") in the figure, which is the second direction, above the source line SL, and a plurality of bit lines BL0 to BL3, which is the third lines, extending in the direction of I-I' line (hereinafter referred to as "column direction") in the figure, which is the third direction, so as to cross the word lines WL. Desirably, the word lines WL, the bit lines BL, and the source line SL are composed of heat-resistive low-resistance material such as W, WSi, NiSi, and CoSi. A memory cell MC is arranged at each intersection of the plurality of word lines WL and bit lines BL.

Each memory cell MC is formed into a cylindrical column in which the word line WL extends between the source line SL and the bit line BL. The portion above the word line WL is defined as a variable resistor VR, and the other portion is defined as polysilicon (p-Si) doped with $p^+$-type impurity. A gate insulating film GIS is interposed between the polysilicon and the word lines WL. The gate insulating film GIS and the polysilicon form a transistor. Further, the transistor TR and the variable resistor VR form the memory cell MC.

FIG. 3 is a view showing an example of the variable resistor VR. The variable resistor VR shown in FIG. 3 includes a recording layer 12 formed between electrode layers 9, 11. The recording layer 12 is made of a composite compound having at least two types of cation elements. At least one of the cation elements is a transition element having the d-orbit incompletely filled with electrons, and the shortest distance between adjacent cation elements is 0.32 nm or less. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a $LiMoN_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 3, A is Zn, M is Mn, and X is O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, some diffused ions in the recording layer 12 migrate toward the electrode layer 13 to reduce diffused ions in the recording layer 12 relative to anions. The diffused ions having arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. Upon regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for a sufficient time, which causes Joule heating to facilitate the oxidation reduction reaction in the recording layer 12. Application of an electric field in the opposite direction from that at the time of setting may also allow resetting.

The setting/resetting operation to the memory cell MC using the transistor according to the present embodiment will be described below.

Before describing the present embodiment, a setting/resetting operation to the memory cell using a diode will firstly be described.

Figure 21:
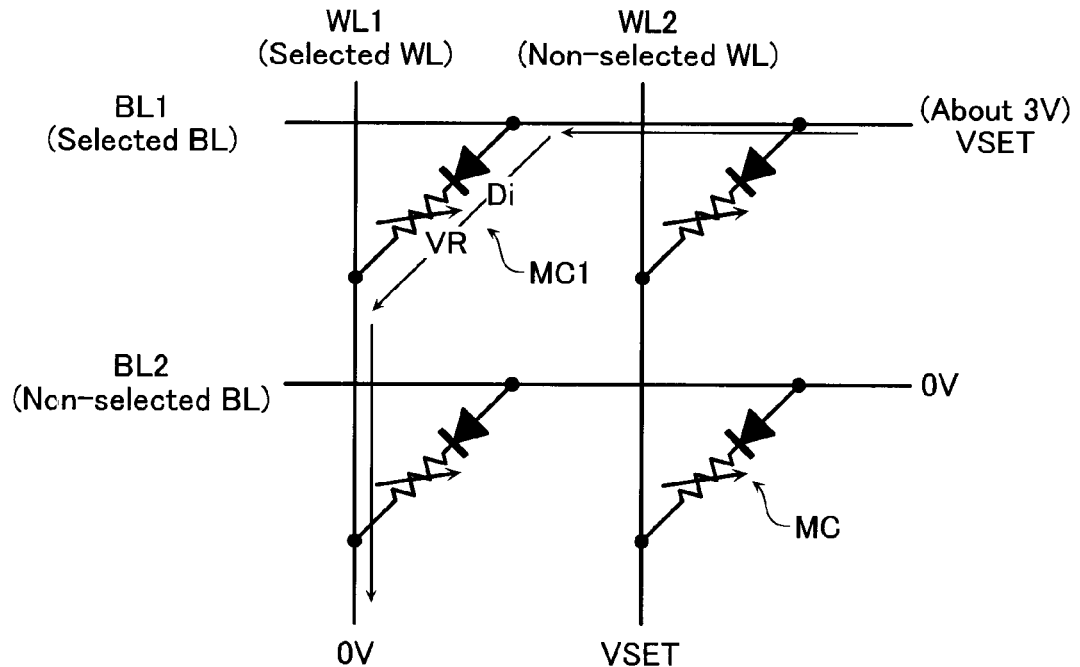
FIG. 21 is an equivalent circuit diagram of a memory cell array in a nonvolatile semiconductor memory device according to a comparative example.

FIG. 21 is an equivalent circuit diagram showing a part of the memory cell array according to a comparative example. The memory cell array includes a plurality of word lines WL and bit lines BL, which cross each other, and a memory cell MC arranged at each intersection of the plurality of word lines WL and bit lines BL. The memory cell MC includes a diode Di and a variable resistor VR that are connected in series.

Figure 22:
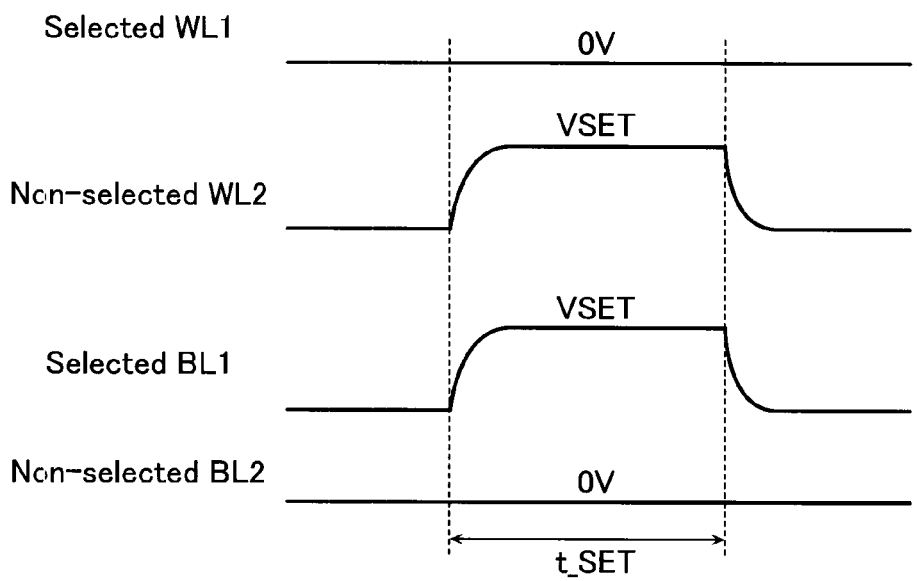
FIG. 22 is a graph illustrating pulse voltages for realizing a writing operation in the nonvolatile semiconductor memory device according to the comparative example.

FIG. 22 is a waveform chart during the setting operation to the memory cell MC1 connected at the intersection between the word line WL1 and the bit line BL1 shown in FIG. 21.

The word lines WL and the bit lines BL of the memory cell array are usually at "L".

During the setting operation, the non-selected word line WL2 and the selected bit line BL1 are set to have a set voltage VSET, which is required for the setting operation of the variable resistor VR, for a predetermined period t-SET (e.g., 10 ns to 100 ns). The set voltage VSET is, for example, 1.5 V. Considering the forward voltage of the diode Di that is 0.6 V, the set voltage VSET is 2.1 V. As a result, the diode Di in the memory cell MC1 is forward biased and accordingly current flows in the direction of the arrow in FIG. 21. The variable resistor VR in the memory cell MC1 changes from the high-resistance state to the low-resistance state. On the other hand, the diodes Di in the other memory cells MC are reverse biased, so that voltage is not applied to the variable resistors VR in the memory cells MC. Accordingly, the resistance state is not changed.

During the resetting operation, the non-selected word line WL1 and the selected bit line BL1 are set to have a reset voltage VRESET, which is required for the resetting operation of the variable resistor VR and which is lower than the set voltage, for a predetermined period t-RESET (e.g., 500 ns to 2 μs) that is longer than the period t-SET. The reset voltage VRESET is, for example, 0.6 V. Considering the forward voltage of the diode Di that is 1.0 V, the reset voltage VRESET is 1.6 V. As a result, Joule heat is generated in the variable resistor VR, so that the variable resistor VR in the memory cell MC1 changes from the low-resistance state to the high-resistance state.

Next, the setting/resetting operation of the memory cell according to the present embodiment will be described.

Figure 4:
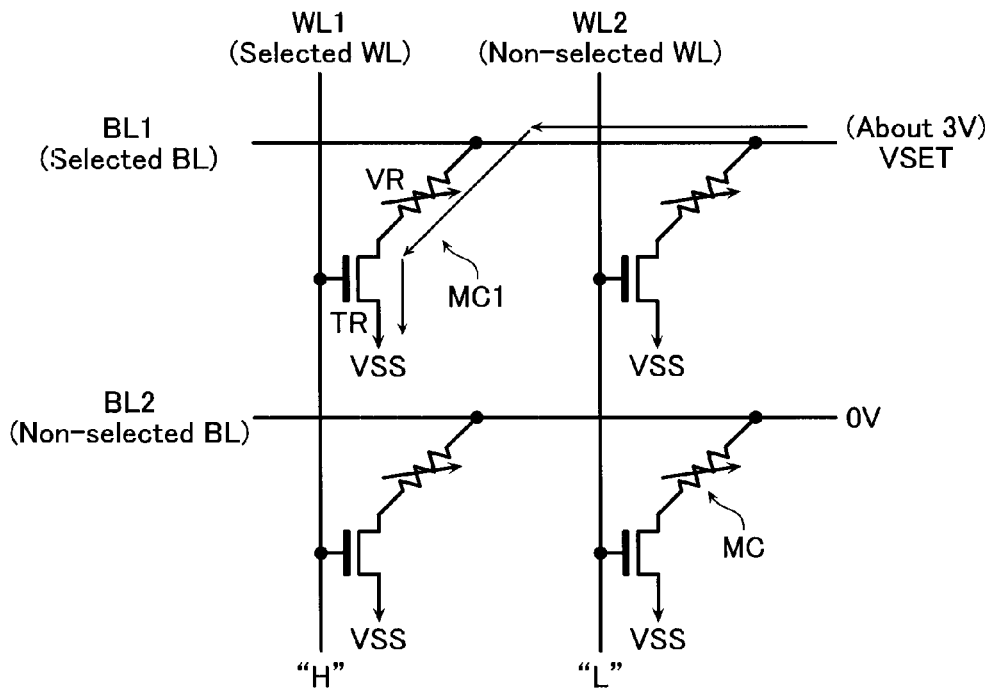
FIG. 4 is an equivalent circuit diagram of the memory cell array in the nonvolatile semiconductor memory device according to the first embodiment.

FIG. 4 is an equivalent circuit diagram showing a part of the memory cell array 100 in the nonvolatile semiconductor memory device according to the present embodiment. The memory cell MC, which includes a transistor TR and a variable resistor VR connected in series, is arranged at the intersection of the word line WL and the bit line BL as shown in FIG. 4.

Figure 5:
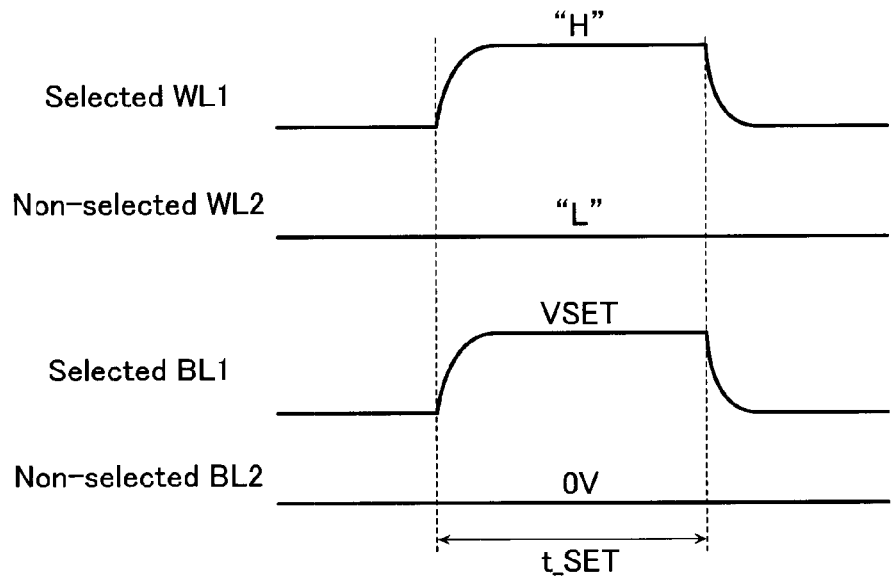
FIG. 5 is a graph illustrating pulse voltages for realizing a writing operation in the nonvolatile semiconductor memory device according to the first embodiment.

FIG. 5 is a waveform chart during the setting operation to the memory cell MC1 connected at the intersection of the word line WL1 and the bit line BL1 in FIG. 4.

The word lines WL and the bit lines BL of the memory cell array are usually at "L".

During the setting operation, the selected word line WL1 is set at "H", and the selected bit line BL1 is set to have the set voltage VSET for the period t-SET. As a result, the transistor TR in the memory cell MC1 is turned on, whereby current flows in the direction indicated by the arrow in FIG. 4. Therefore, the variable resistor VR in the memory cell MC1 changes from the high-resistance state to the low-resistance state. On the other hand, the transistors TR in the other memory cells MC are kept to be off, so that the resistance state of the variable resistor VR is not changed.

During the resetting operation, the selected word line WL1 may be set at "H", and the reset voltage VRESET may be applied to the selected bit line BL1 during the period t-RESET, like the setting operation.

As is understood from the above, in the comparative example, the voltages of all non-selected word lines WL except for the selected word line WL1 have to rise to the set voltage VSET or reset voltage VRESET during the setting/resetting operation. Therefore, the power consumption increases, and further, a first access to the memory cell MC1 is delayed.

On the other hand, according to the present embodiment, only the voltage of the selected bit line BL1 is set to the set voltage VSET or the reset voltage VRESET as shown in FIG. 4. Therefore, the power consumption is reduced, and the first access can be accelerated, compared to the comparative example.

In the description above, a CMOS transistor is used for the transistor TR in the memory cell MC. However, a bipolar transistor can be used for the transistor TR.

[Structure of Memory Cell Array]

Next, a structure of the memory cell array using the memory cell described above will be described.

Before describing the structure of the memory cell array according to the present embodiment, a structure of a memory cell array 600 according to a comparative example will be described with reference to FIG. 23.

The memory cell array 600 according to the comparative example includes a word line WL extending in the row direction, a source line SL extending in the row direction, and a bit line BL extending in the column direction. These lines are formed on a silicon substrate 601, and stacked in a different layer. The source line SL is connected to an impurity-diffusion layer 602 in the silicon substrate 601 through a conductor 604. The bit line BL is connected to an impurity-diffusion layer 603 in the silicon substrate 601 through the variable resistor VR and a conductor 605. The word line WL is connected to the position between the impurity-diffusion layers 602 and 603 in the silicon substrate 601 through a gate insulating film 606. In this arrangement, the direction of the gate length of the transistor in the memory cell is the column direction. In order to arrange one memory cell, an arrangement area having a width equal to the total of the widths in the column direction of the variable resistors VR, connected to the source line SL, the word line WL, and the bit line BL, is needed.

Subsequently, the structure of the memory cell array 100 according to the present embodiment will be described.

Figure 6A:
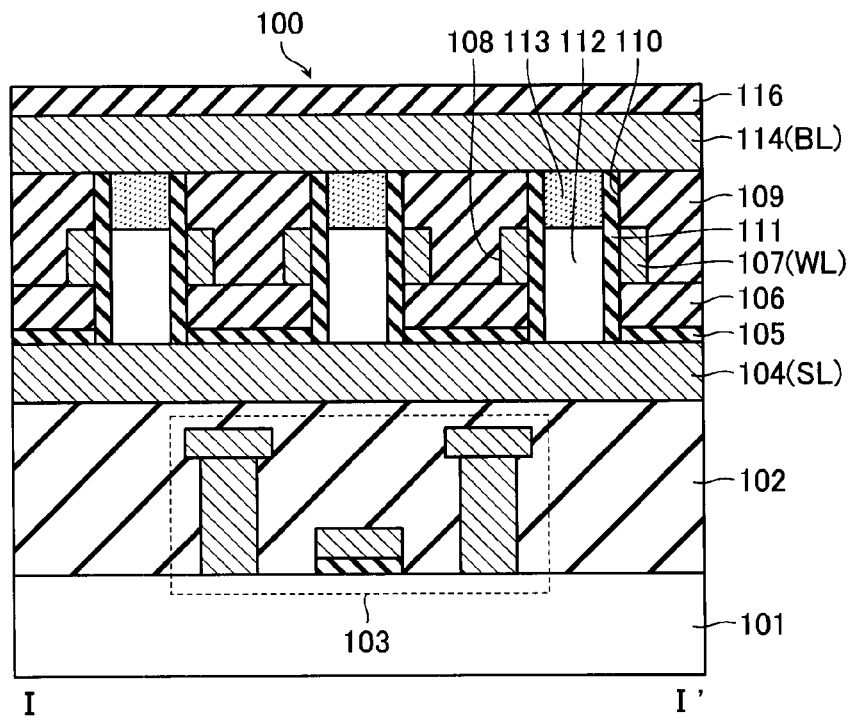
FIG. 6A is a cross-sectional view of one memory cell array taken along line I-I' and seen from the direction of the arrow in FIG. 2.
Figure 6B:
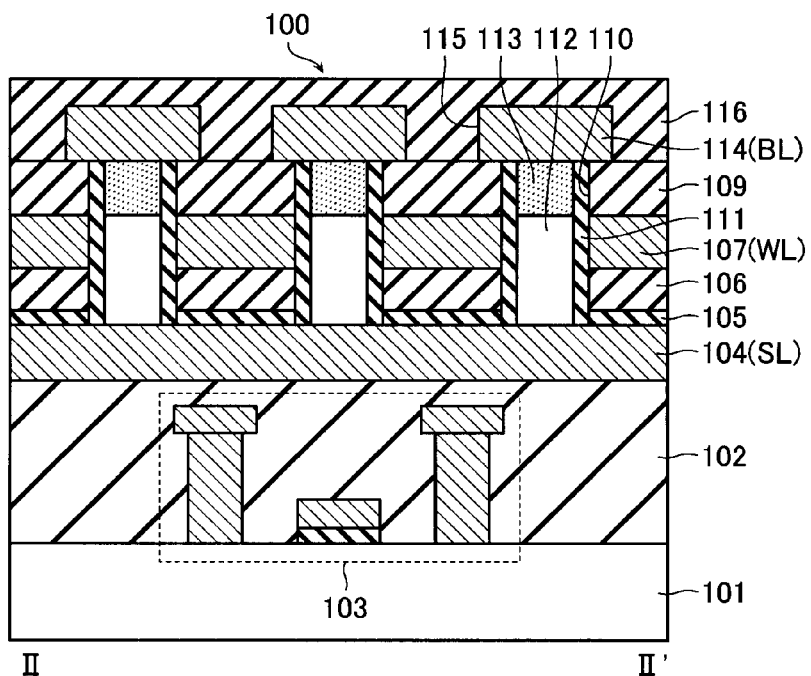
FIG. 6B is a cross-sectional view of one memory cell array taken along line II-II' and seen from the direction of the arrow in FIG. 2.
Figure 6C:
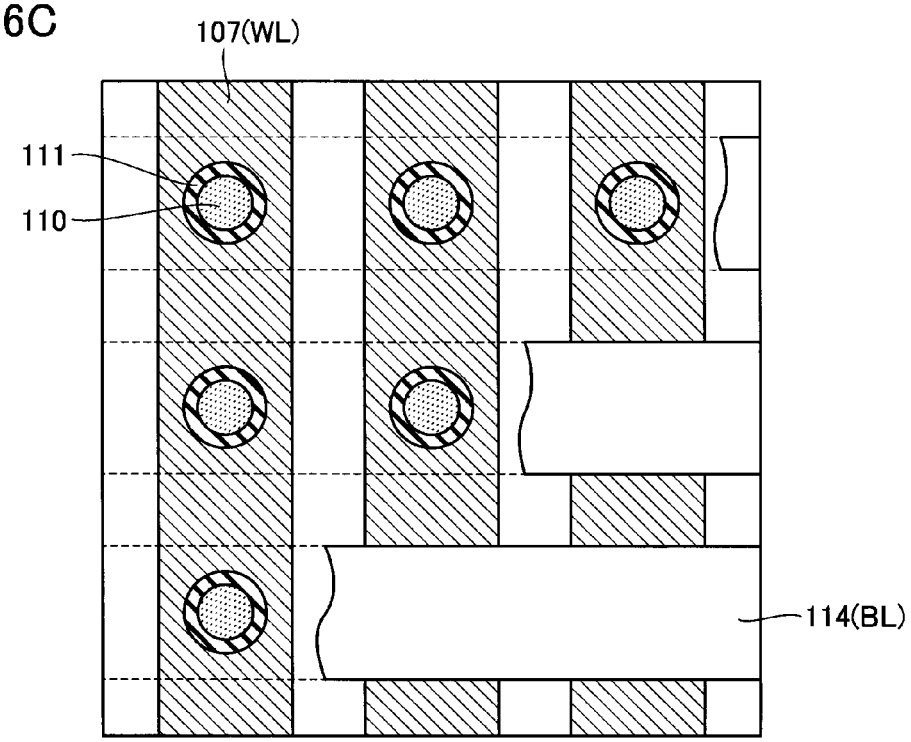
FIG. 6C is a view seen from the top surface of the nonvolatile semiconductor memory device in the stacking direction in FIG. 2.

FIGS. 6A and 6B are cross-sectional views taken along a line I-I' and a line II-II' in FIG. 2. FIG. 6C is a view seen from the top surface of the memory cell array in the stacking direction that is the first direction.

A peripheral circuit 103 such as a sense amplifier circuit is formed on a silicon substrate 101. A first insulating film 102 is formed to cover the peripheral circuit 103. Since the peripheral circuit is arranged at the lower portion of the memory cell array 100, the chip area of the nonvolatile semiconductor memory device can be made substantially equal to the area of the memory cell array 100.

A plane first metal 104 serving as the source line SL, which is the first line, is formed from a low-resistance metal such as W on the first insulating film 102. A second metal 107 is formed on the first metal 104 through a protection film 105 and a second insulating film 106. The second metal 107 is divided by a plurality of trenches 108 extending in the row direction that is the second direction. Each of the divided portions is the word line WL that is the second line. A third insulating film 109 is formed on the second insulating film 106 formed at the bottom of the trench 108, the trench 108, and the second metal 107. A third metal 114 is formed on the third insulating film 109. The third metal 114 is divided by a plurality of trenches 115 extending in the column direction that is the third direction. Each of the divided portions is the bit line BL that is the third line. A transistor hole 110 having a cylindrical column shape and formed between the source line SL and the bit line BL is formed at the intersection of the word line WL and the bit line BL. A hollow cylindrical gate insulating film 111 having a predetermined thickness is formed at the inner wall of the transistor hole 110. A polysilicon 112 composing the transistor TR is embedded into the inner wall of the gate insulating film 111 to the height equal to the top surface of the word line WL from the top surface of the source line SL. A variable resistor 113 is embedded from the top of the polysilicon 112 to the lower surface of the bit line BL. The gate insulating film 111, the polysilicon 112, and the variable resistor 113 form the memory cell MC.

Further, a fourth insulating film 116 is formed on the third insulating film 109, the trenches 115, and the third metal 114.

Figure 23:
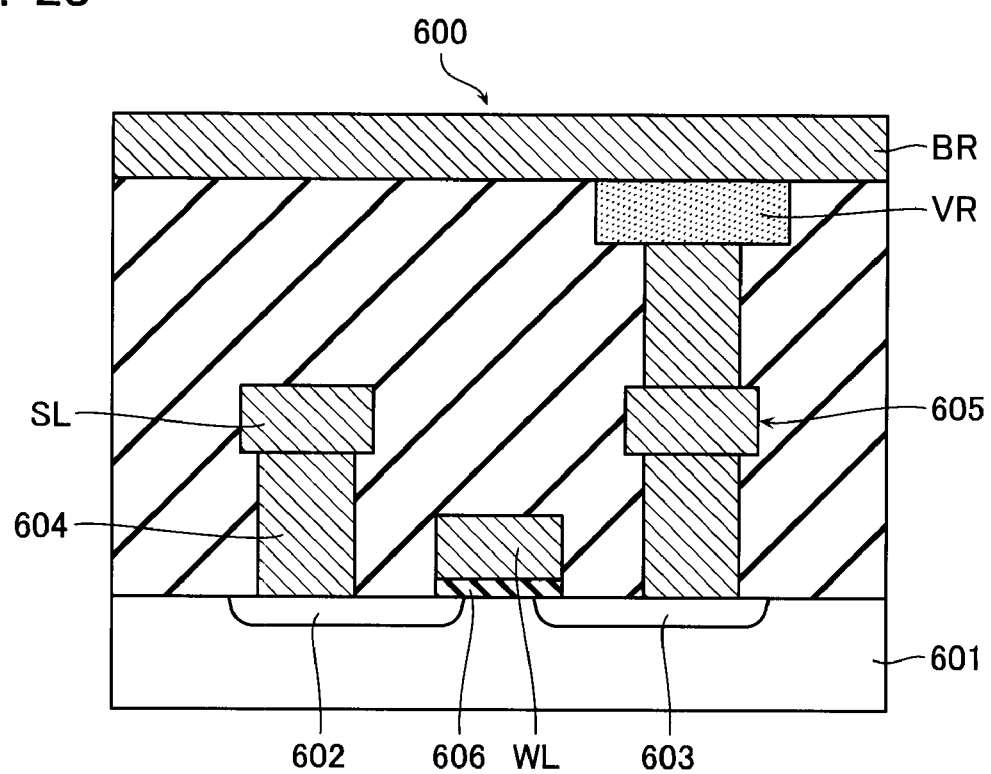
FIG. 23 is a cross-sectional view illustrating one memory cell in a nonvolatile semiconductor memory device according to another comparative example.

When the memory cell is configured two-dimensionally as in the comparative example shown in FIG. 23, a sufficient channel length cannot be secured, if the arrangement area of the memory cell is reduced. Therefore, a short channel effect is increased. Accordingly, it is difficult to reduce the arrangement area. Since the source line SL has a linear shape, the wiring resistance is great, so that the power consumption increases, and the property of the memory cell varies.

According to the present embodiment, the memory cell MC can be arranged at the intersection of the word line WL and the bit line BL. Accordingly, a highly integrated memory cell array can be realized, compared to the comparative example. By virtue of this, the increase in the chip area can be suppressed, whereby reduced cost can be realized. Since the direction of the gate length of the transistor TR is the stacking direction of the memory cell array 100, the short channel effect can be eased. Further, since the source line SL has a flat plane shape, the wiring resistance can be reduced, whereby the increase in the power consumption and variation in the property of the memory cell MC can be reduced.

[Production Method of Memory Cell Array]

The production method of the memory cell array 100 according to the present embodiment will be described with reference to FIGS. 7 to 16. FIGS. 7A to 16A are sectional views taken along the line I-I' in FIG. 2, while FIGS. 7B to 16B are sectional views taken along the line II-II' in FIG. 2.

Figure 7A:
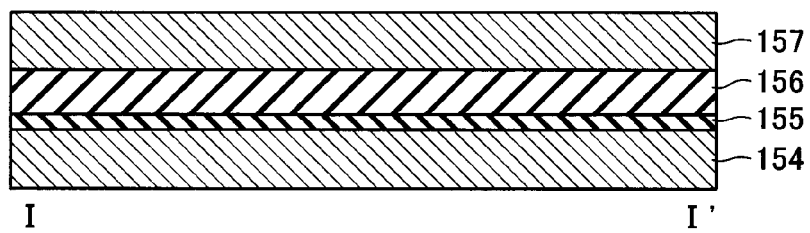
Figure 7B:
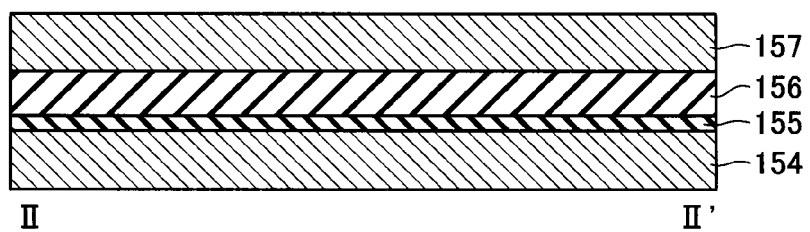

First, a metal layer 154, serving as the first line layer and made of tungsten (W), a protection layer 155 made of silicon nitride (SiN), a first insulating layer 156 made of silicon oxide ($SiO_2$), and a metal layer 157, serving as the second line layer and made of tungsten (W), are sequentially stacked on the top surface of the layer, which is to be the first insulating layer in FIG. 2, as shown in FIGS. 7A and 7B. These become the first metal 104 serving as the source line SL, the protection film 105, the second insulating film 106, and the second metal 107.

Figure 8A:
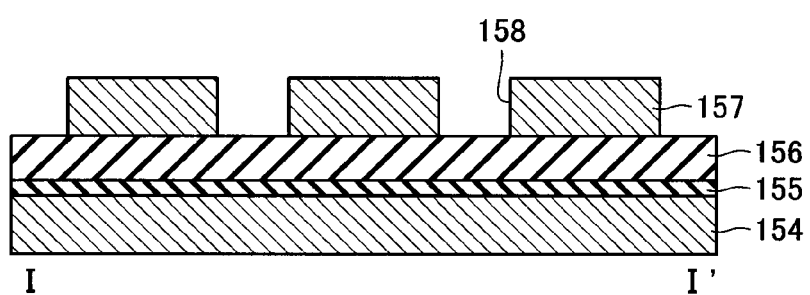
Figure 8B:
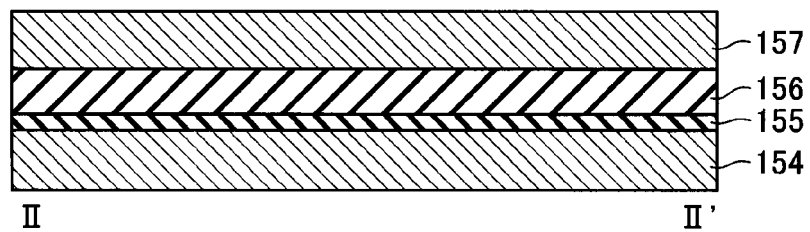

Next, in FIGS. 8A and 8B, a hard mask of TEOS, not shown, is formed on the top surface of the metal layer 157. A first anisotropy etching is executed with this hard mask used as a mask. By this process, a trench 158 penetrating the metal layer 157 and extending in the row direction with a predetermined pitch is formed. The metal layer 157 becomes the word line WL serving as the second line.

Figure 9A:
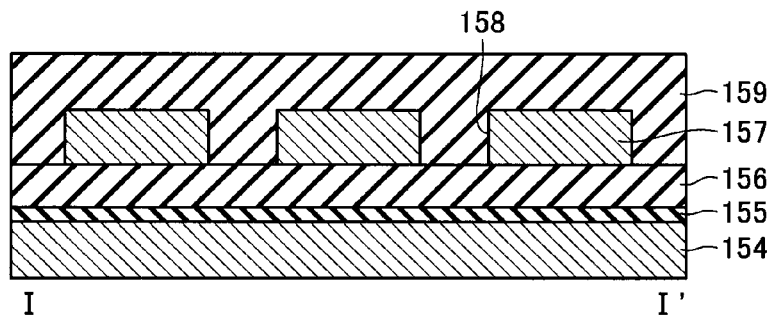
Figure 9B:
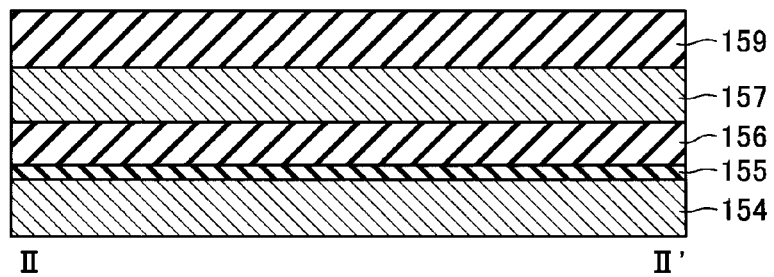

Then, in FIGS. 9A and 9B, a second insulating layer 159 made of silicon oxide ($SiO_2$) is formed on the top surfaces of the insulating layer 156 and the metal layer 157. The insulating layer 159 becomes the third insulating film 109.

Figure 10A:
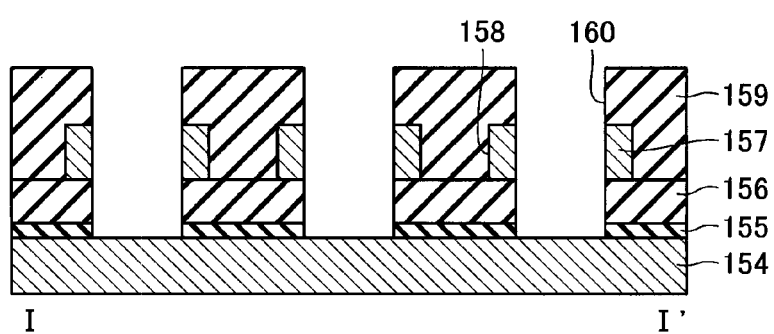
Figure 10B:
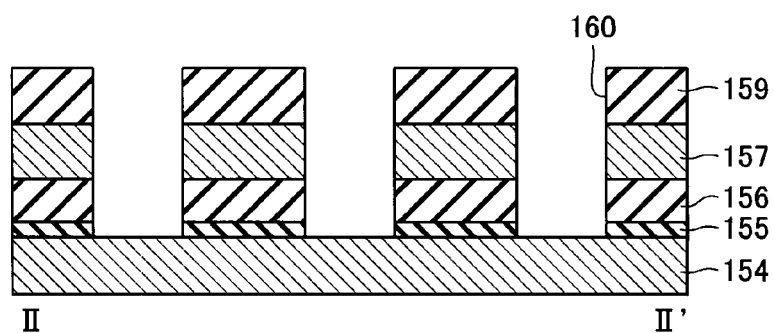

Subsequently, in FIGS. 10A and 10B, a transistor hole 160 (corresponding to the transistor hole 110 in FIGS. 6A and 6B), which has a cylindrical column shape, penetrates the protection layer 155, the insulating layer 156, the metal layer 157, and the insulating layer 159, and serves as a memory-cell forming hole, is formed. The transistor hole 160 is formed in a matrix, as viewed from the top surface of the memory cell array 100 in the stacking direction, at the position matching the metal layer 157.

Figure 11A:
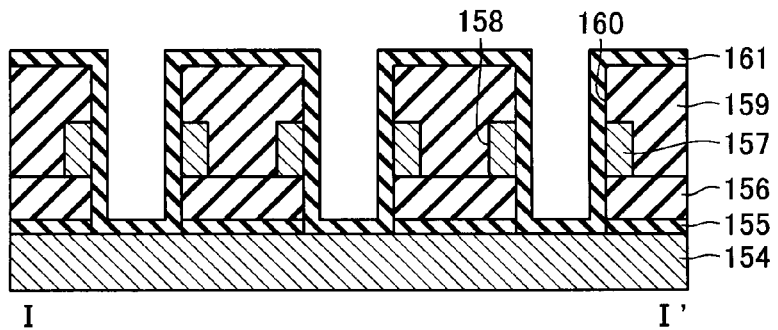
Figure 11B:
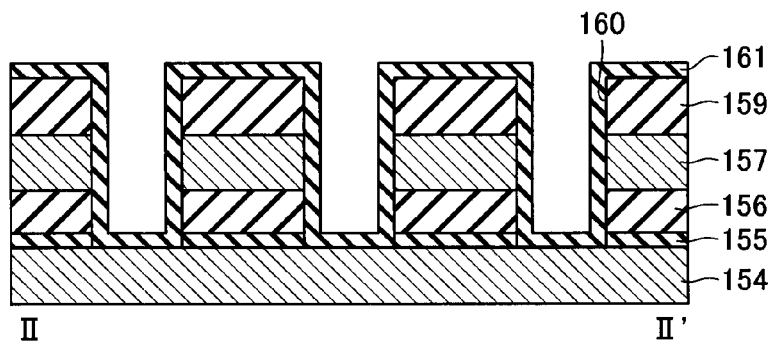

Next, in FIGS. 11A and 11B, a gate insulating layer 161 made of silicon oxide ($SiO_2$) is stacked so as to cover the inner wall of the transistor hole 160 and the top surface of the insulating layer 159 with a CVD (Chemical Vapor Deposition).

Figure 12A:
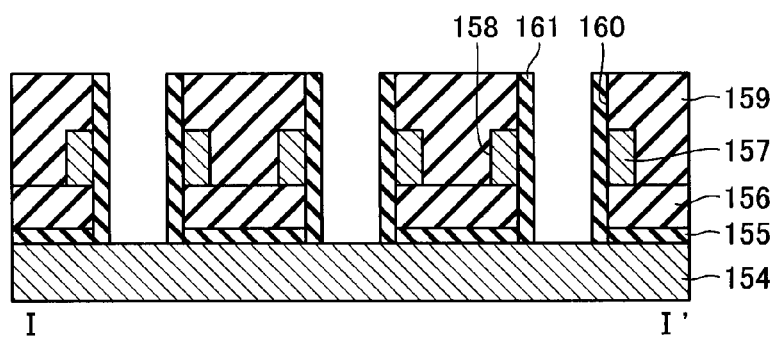
Figure 12B:
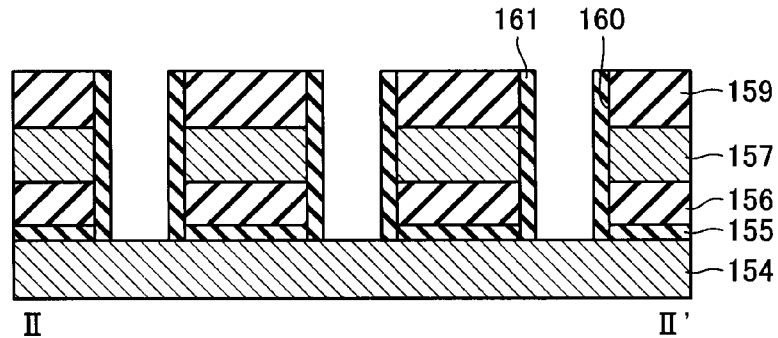

Then, in FIGS. 12A and 12B, the bottom portion of the transistor hole 160 and the gate insulating layer 161 on the top surface of the insulating layer 159 are selectively etched in order to remove them. According to this process, the gate insulating film 111 is formed.

Figure 13A:
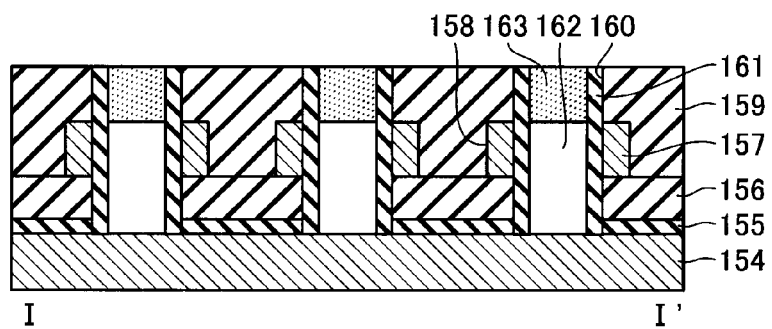
Figure 13B:
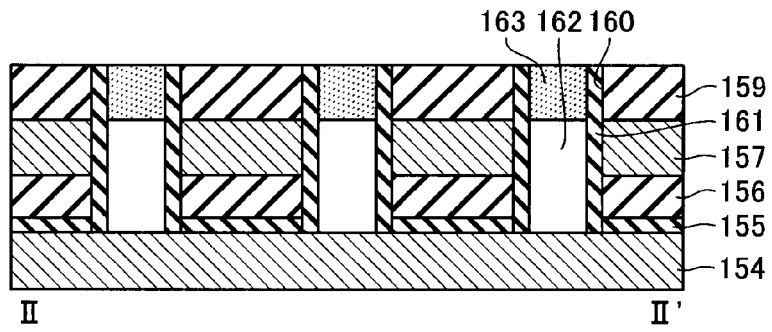

Next, in FIGS. 13A and 13B, a polysilicon 162 (corresponding to the polysilicon 112 in FIG. 2) made of p+ polysilicon (p-Si) and a variable resistor material 163 that becomes the variable resistor VR are sequentially stacked so as to fill the transistor hole 160. The polysilicon 162 is stacked to have a height equal to the top surface of the metal layer 157. The polysilicon 162 and the variable resistor material 163 form the memory cell MC. Thereafter, the top surfaces of the insulating layer 159, the gate insulating layer 161, and the variable resistor material 163 are flattened by CMP.

Figure 14A:
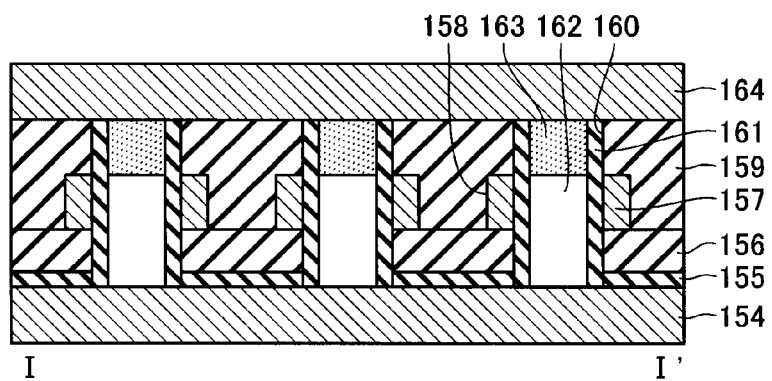
Figure 14B:
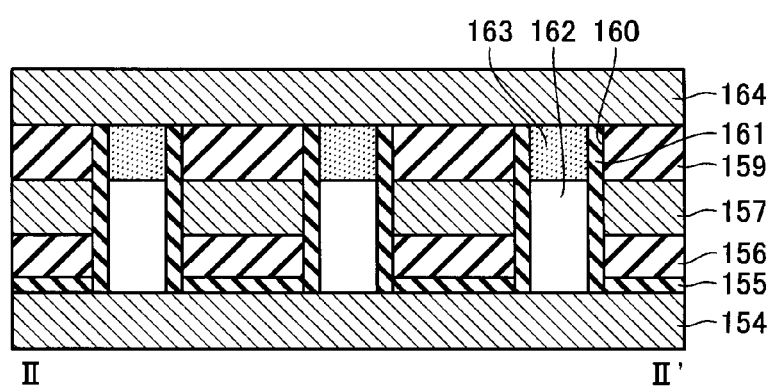

Subsequently, in FIGS. 14A and 14B, a metal layer 164, which is made of tungsten (W) and serves as the third line layer, is stacked onto the top surfaces of the flattened insulating layer 159, the gate insulating layer 161, and the variable resistor material 163.

Figure 15A:
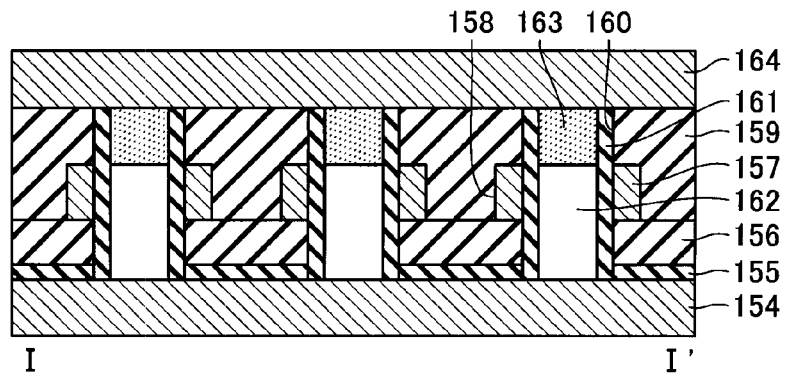
Figure 15B:
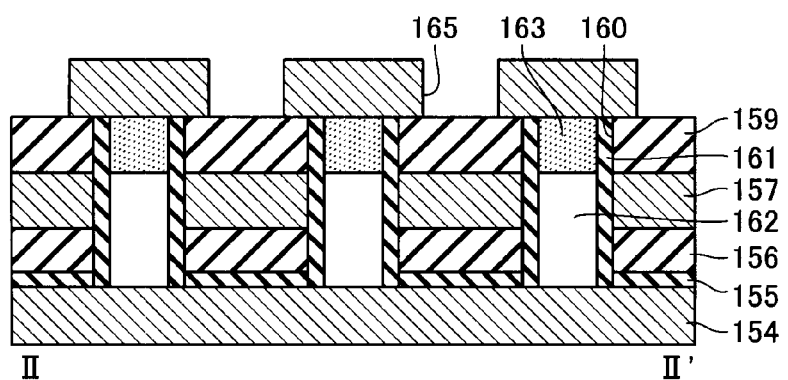

Then, in FIGS. 15A and 15B, a hard mask of TEOS, not shown, is formed on the top surface of the metal layer 164. A second anisotropy etching is executed with this hard mask used as a mask. By virtue of this process, a trench 165 (corresponding to the trench 115 in FIG. 2) penetrating the metal layer 164 and extending in the column direction with a predetermined pitch is formed. According to this process, the metal layer 164 becomes the bit line BL serving as the third line.

Figure 16A:
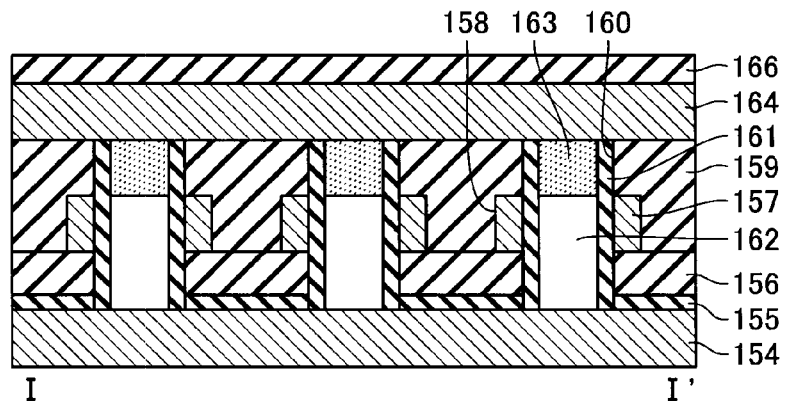
Figure 16B:
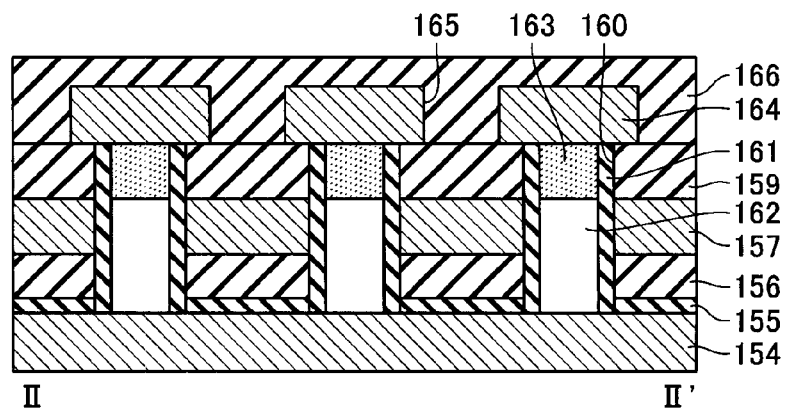

Finally, in FIGS. 16A and 16B, a third insulating layer 166 made of silicon oxide ($SiO_2$) is stacked on the top surfaces of the insulating layer 159 and the metal layer 164. This insulating layer 166 becomes the fourth insulating film 116.

As described above, the present embodiment can provide a nonvolatile semiconductor memory device that can realize high integration and reduced cost, while keeping high-speed property and low power consumption, which are characteristics of a bipolar memory cell, and a production method thereof.

[Second Embodiment]

A nonvolatile semiconductor memory device according to the second embodiment of the present invention is a nonvolatile semiconductor memory device having the stacked plural memory cell arrays according to the first embodiment.

Figure 17:
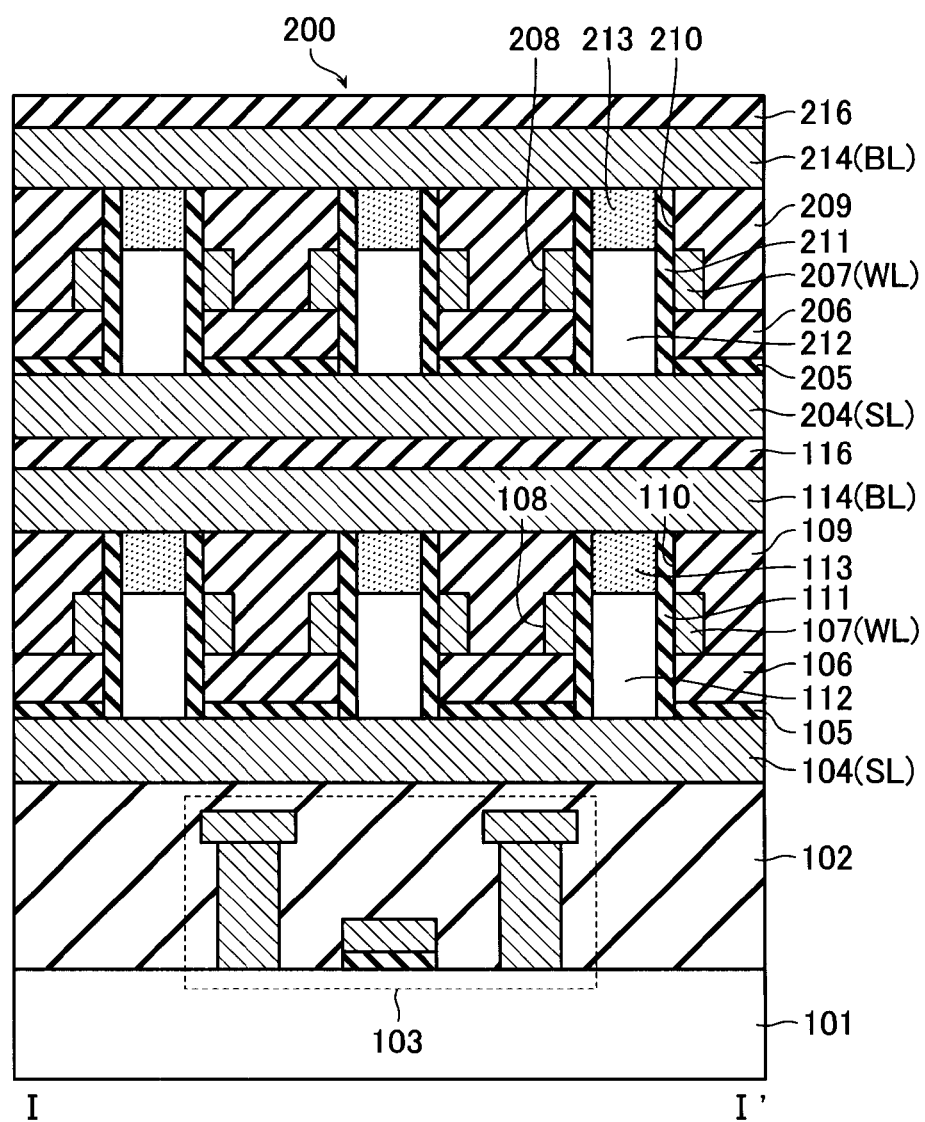
FIG. 17 is a cross-sectional view showing a part of a memory cell array in a nonvolatile semiconductor memory device according to a second embodiment of the present invention.

A memory cell array 200 shown in FIG. 17 is one example of a double-layer structure. The memory cell array 200 has a structure in which layers 204 to 206, having the same configuration as the layers 104 to 116, are stacked on the top surface of the layer 116 of the memory cell array 100.

When the memory cell array 200 is produced, the processes in FIGS. 7 to 16 may be repeated after the third insulating layer 166 is stacked in the production process of the memory cell array 100.

The memory cell array 200 can realize the large-capacity nonvolatile semiconductor memory device that keeps high integration of the memory cell array 100.

Figure 18:
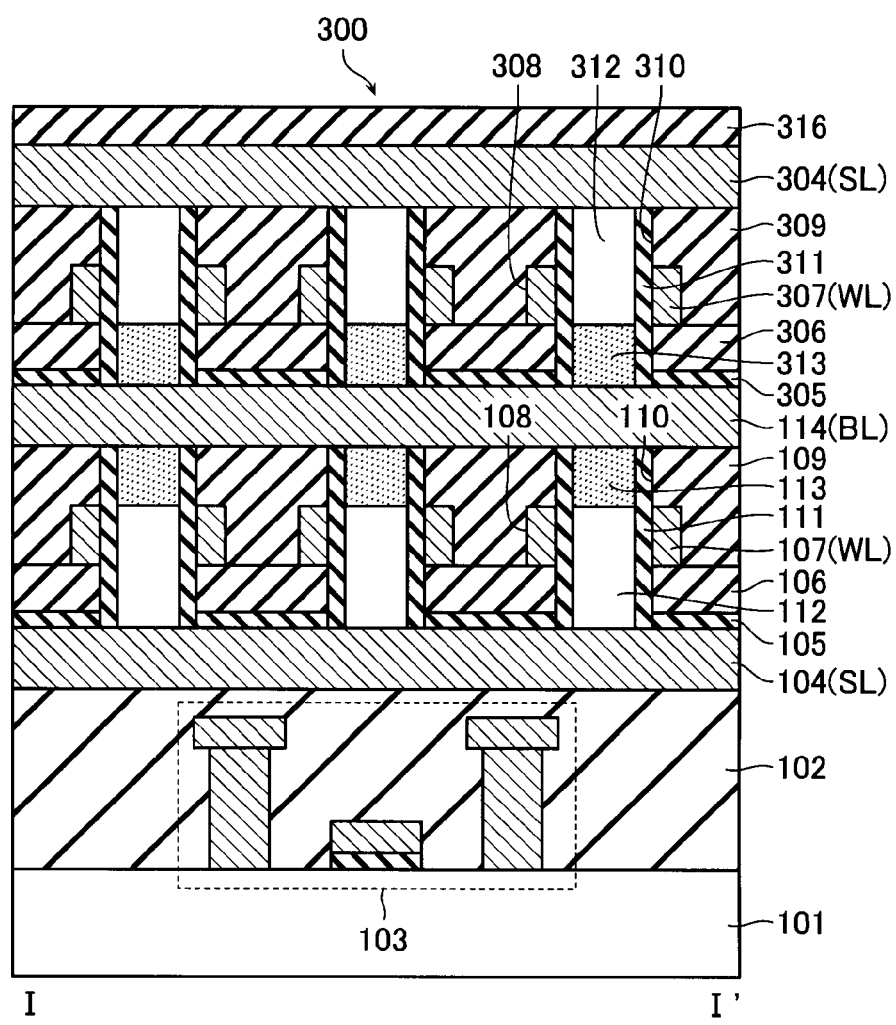
FIG. 18 is a cross-sectional view of a part of the memory cell array in the nonvolatile semiconductor memory device according to the second embodiment.

A memory cell array 300 shown in FIG. 18 is also an example of the double-layer structure. Unlike the memory cell array 200, the bit line 114 serving as the third line is shared by the upper and lower layers in the memory cell array 300. A source line 304, a variable resistor 313, and the polysilicon 112, which are obtained by turning the source line 104, the variable resistor 113, and the polysilicon 112 upside down, are formed on the bit line 114 of the memory cell array 100.

When the memory cell array 300 is produced, the insulating layer 166 may be etched back until the top surface of the bit line 114 appears, and then, the layer that is to become the memory cell MC and the metal layer 304 that is to become the source line SL may be sequentially formed, after the process shown in FIGS. 16A and 16B.

The memory cell array 300 can provide large capacity like the memory cell array 200, and further, provide much higher integration, since the line layer is reduced due to the sharing of the bit line 114.

The memory cell arrays 200 and 300 have the two-layer structure. However, a multi-layer structure having three or more layers can be formed by repeatedly stacking the layers.

[Third Embodiment]

Figure 19:
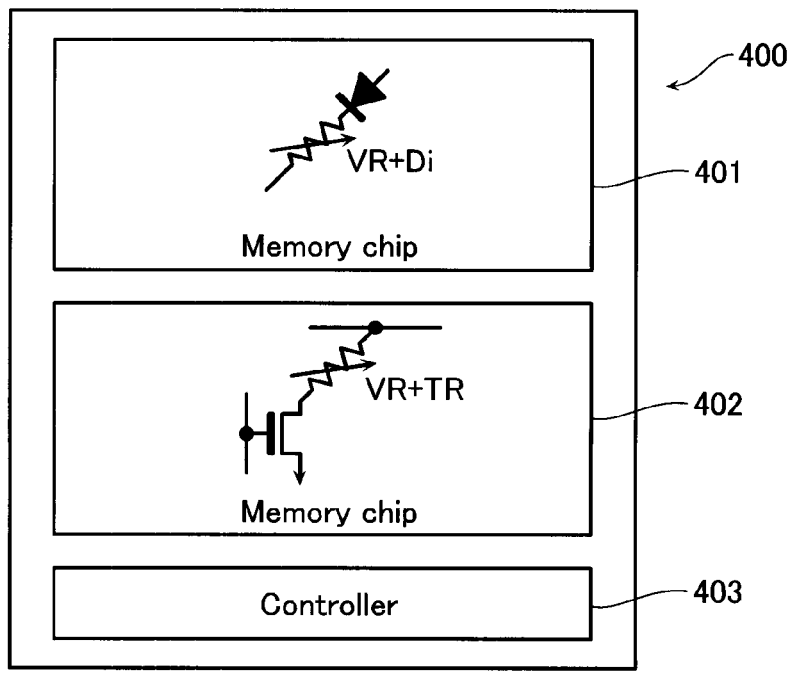
FIG. 19 is a block diagram illustrating a memory system according to a third embodiment of the present invention.
Figure 20:
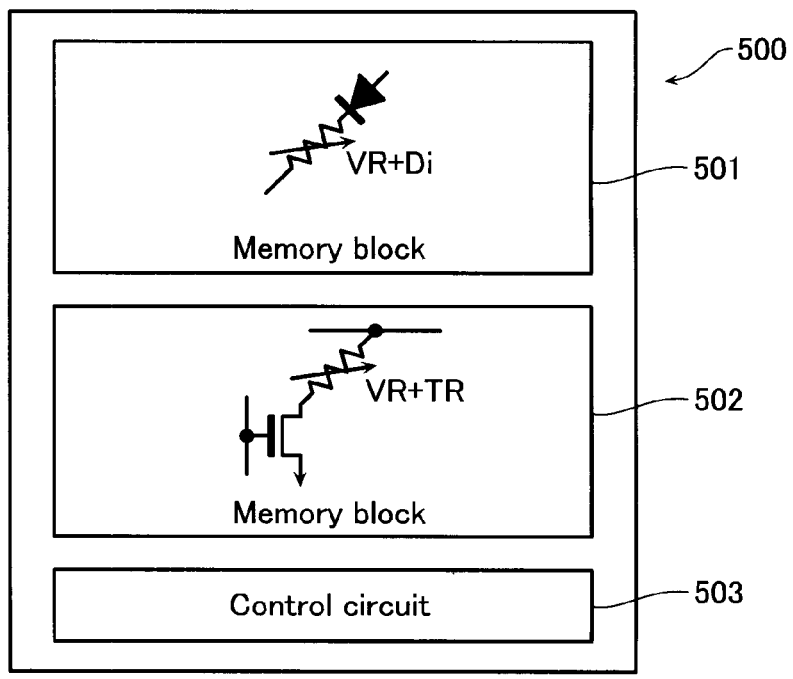
FIG. 20 is a block diagram illustrating a memory chip according to the third embodiment.

As shown in FIGS. 19 and 20, a nonvolatile semiconductor memory device according to the third embodiment of the present invention is a semiconductor memory device having both of a memory cell array block including the above-mentioned memory cell using a diode, and a memory cell array block including a memory cell using a transistor.

In this case, a high integration property, which is the characteristic of the memory cell that employs a diode, and a high-speed property and reduced power consumption, which are the characteristics of the memory cell that employs a transistor, can both be achieved.

FIG. 19 shows a memory system 400, such as a memory card, including a memory chip 401 that includes a memory cell using a diode and serves as a second memory section, a memory chip 402 that includes a memory cell using a transistor and serves as a first memory section, and a controller 403 that controls the access to the memory chips 401 and 402.

FIG. 20 shows a memory chip 500 including a memory block 501 that includes a memory cell using a diode and serves as a second memory section, a memory block 502 that includes a memory cell using a transistor and serves as a first memory section, and a control circuit 503 that controls the access to the memory blocks 501 and 502.

The example of use of the memory system and the memory chip described above will be described below.

As a first example of use, the memory chip 401 or the memory block 501 is defined as a data memory area, and the memory ship 402 or the memory block 502 is used as a code memory area.

In this case, the memory system 400 or the memory chip 500 can be provided in which a large capacity data storage utilizing high integration, which is the characteristic of the memory cell employing a diode, can be realized, and further, a code execution utilizing the high-speed property, which is the characteristic of the memory cell employing a transistor, can be realized.

As a second example of use, the memory chip 401 or the memory block 501 is defined as a main data storage area, and the memory chip 402 or the memory block 502 is used as a cache area.

In this case, data is temporarily stored in the memory chip 402 or the memory block 502 by utilizing the high-speed property that is the characteristic of the memory cell employing a transistor, and then, the data can be transferred to the large-capacity memory chip 401 or the memory block 501 utilizing the high integration that is the characteristic of the memory cell employing a diode.

As a third example of use, the memory cell using a transistor is used as a bipolar memory cell. The polarity of the voltage applied to the bit line and the word line is reversed with respect to the common source voltage VSS, whereby the memory cell using a transistor can function as a bipolar memory cell. The bipolar memory cell can be operated at lower voltage than a unipolar memory cell. Therefore, in the third example, the memory chip 401 or the memory block 501 is used as an operation area with high voltage, and the memory chip 402 or the memory block 502 is used as an operation area with low voltage.

In this case, the memory system or the memory chip can be provided in which large-capacity data can be hand-speed by the memory chip 401 or the memory block 501 under the environment where high voltage can be secured, and under the environment where power saving is needed, high-speed property can be secured and reduced power consumption can be realized by the memory chip 402 or the memory block 502.

What is claimed is:

1. A nonvolatile semiconductor memory device comprising:
    a memory cell array layer including a first line; a plurality of second and third lines that are formed below or above the first line and that cross each other; and a plurality of memory cells arranged at each intersection of the second and third lines,
    the memory cell including a variable resistor and a transistor, which are connected to each other in series between the first line and the third line,
    the variable resistor being electrically rewritable and storing a resistance value as data in a nonvolatile manner,
    the variable resistor and the transistor including a columnar silicon body extending in a first direction, which is a stacking direction, from the first line to the third line, and
    the transistor including the second line arranged at a side face of the columnar silicon body and a gate insulating layer provided between the columnar silicon body and the second line.

2. The nonvolatile semiconductor memory device according to claim 1, including:
    a semiconductor substrate having a peripheral circuit formed thereon, wherein
    one or more memory cell array layers are stacked on the peripheral circuit on the semiconductor substrate.

3. The nonvolatile semiconductor memory device according to claim 1, wherein
    the memory cell array layers adjacent in the first direction have the first and third lines independently.

4. The nonvolatile semiconductor memory device according to claim 1, wherein
    the memory cell array layers adjacent in the first direction share the first or third lines.

5. The nonvolatile semiconductor memory device according to claim 4, wherein
    the memory cell array layer adjacent in the first direction has a structure that is turned upside down in the first direction.

6. The nonvolatile semiconductor memory device according to claim 1, wherein
    the first line has a planar shape in which a plurality of memory cells are arranged in the second direction, in which the second line extends, and in the third direction, in which the third line extends, respectively.

7. The nonvolatile semiconductor memory device according to claim 1, wherein
    the direction of a gate length of the transistor is the first direction.

8. The nonvolatile semiconductor memory device according to claim 1, further comprising
    a protection film and an insulating film being provided between the first and second lines.

9. The nonvolatile semiconductor memory device comprising:
    a first memory section including a first memory cell array layer having a first line, a plurality of second and third lines that are formed above or below the first line and cross each other, and a plurality of first memory cells arranged at each intersection of the second and third lines;
    a second memory section including a second memory cell array layer having a plurality of fourth and fifth lines that cross each other, and a plurality of second memory cells arranged at each intersection of the fourth and fifth lines; and
    a control section that controls a memory operation of the first and second memory sections,
    the first memory cell including a variable resistor and a transistor connected in series between the first and third lines, the variable resistor being electrically rewritable and storing a resistance value as data in a nonvolatile manner, and the transistor being a columnar transistor having the second line arranged at its side face as a gate, and
    the second memory cell including a variable resistor and a diode that are connected in series between the fourth and fifth lines, are electrically rewritable, and store the resistance value as data in a nonvolatile manner.

10. The nonvolatile semiconductor memory device according to claim 9, wherein
    the first memory section is a code memory area, and the second memory section is a data memory area.

11. The nonvolatile semiconductor memory device according to claim 9, wherein
    the first memory section is a cache area, and the second memory section is a main memory area.

12. The nonvolatile semiconductor memory device according to claim 9, wherein
    the control section selects either one of the first and second memory sections based on an operation voltage.

13. The nonvolatile semiconductor memory device according to claim 9, wherein
    a polarity of a voltage of the third line to a voltage of the first line when data is written to the memory cell of the first memory section is reverse to a polarity of the voltage of the third line to the voltage of the first line when data is erased from the first memory cell.

\* \* \* \* \*